United States Patent [19]
Sawada

[11] Patent Number: 5,098,638
[45] Date of Patent: Mar. 24, 1992

[54] METHOD OF MANUFACTURING A SEMICONDUCTOR DEVICE

[75] Inventor: Shigeki Sawada, Souraku, Japan

[73] Assignee: Matsushita Electric Industrial Co., Ltd., Osaka, Japan

[21] Appl. No.: 513,812

[22] Filed: Apr. 25, 1990

[30] Foreign Application Priority Data

Apr. 25, 1989 [JP] Japan .................................. 1-104958

[51] Int. Cl.$^5$ ......................................... H01L 21/265
[52] U.S. Cl. ...................................... 437/31; 437/27; 437/162; 437/233; 148/DIG. 123; 148/DIG. 124
[58] Field of Search .................. 437/31, 27, 233, 162; 148/DIG. 123, DIG. 124

[56] References Cited

U.S. PATENT DOCUMENTS 4,837,176 6/1989 Zdebel et al. ........................ 437/31
4,879,252 11/1989 Komatsu ................... 148/DIG. 123

FOREIGN PATENT DOCUMENTS

0094482A2 1/1979 European Pat. Off. .
90304401.4 6/1982 Fed. Rep. of Germany .

OTHER PUBLICATIONS

"70 ps ECL Gate Si Bipolar Technology Using Borosenic-Poly Process W/Coupling-Base Implant", T. Yamaguchi et al., IEEE 1988 Custom Integrated Circuits Conference, May 16–19, 1988, Rochester, NY.
"A Novel Base-Emitter Self-Alignmanet Process for High Speed Bipolar LSIs", Y. Okita et al., IEEE 1988 Custom Integrated Circuits Conference, May 16–19, 1988, Rochester, NY.
"A High-Performance Bipolar Integrated Circuit Process", Irene V. Pecenco et al., Sep. 1982, Hewlett-Packard Journal, pp. 27–29.
Wolf et al., *Silicon Processing for the VLSI ERA*, vol. 1, Lattice Press, Sunset Beach, CA 1986, pp. 216–218.

*Primary Examiner*—Brian E. Hearn
*Assistant Examiner*—Kevin M. Picardat
*Attorney, Agent, or Firm*—Wenderoth, Lind & Ponack

[57] ABSTRACT

A method of manufacturing a semiconductor device forms an intrinsic base layer by doping an impurity in the emitter polysilicon electrode into the intrinsic base region of the surface of a semiconductor substrate by heat treatment through the emitter lead-out part hole self-aligned to the base lead-out electrode. Thus, beneath the insulation film of the substrate surface between the base lead-out part hole and emitter lead-out part hole, the outer marginal part of the intrinsic base layer and the inner marginal part of the extrinsic base layer overlap uniformly. Still more, since the diffusion of the impurity by heat treatment is very fast in the polysilicon emitter electrode as compared with that in the silicon substrate, an extremely shallow intrinsic base layer may be formed.

3 Claims, 3 Drawing Sheets

Spacing between Base and Emitter holes

METHOD OF MANUFACTURING A SEMICONDUCTOR DEVICE

BACKGROUND OF THE INVENTION

The present invention relates to a method of manufacturing a bipolar transistor semiconductor device reduced in dimensions and increased in speed.

Bipolar transistors have recently been reduced in dimensions beyond the limit of photolithographic technology by the self-aligned technology as disclosed, for example, in Japanese Patent Publication No. 55-27469, Japanese Laid-open Patent No. 56-1556, Japanese Patent Publication No. 57-32511 and Japanese Laid-open Patent No. 60-164356, and characteristics of extremely high speed and high performance are realized.

To illustrate a semiconductor device by a prior art and its manufacturing method, an example of manufacturing method of NPN transistor is shown in FIGS. 3(a) to 3(d).

First, as shown in FIG. 3(a), after forming an N-type collector buried layer 19 on the surface of a P-type silicon substrate 18, an N-type epitaxial layer 20 is formed on the surface of the N-type collector buried layer 19. Next, after forming a LOCOS film 21 for device isolation in a specific region on the surface of the N-type epitaxial layer 20, a P+ polysilicon 22 to be used as a base lead-out electrode and a CVD oxide film 23 are sequentially grown on the entire surface of the N-type epitaxial layer 20 and LOCOS film 21. Consequently, the CVD oxide film 23 and then P+ polysilicon 22 are selectively removed by etching, using the photoresist by photolithography as the mask, and an intrinsic base region 24 on the surface of the N-type epitaxial layer 20 is exposed.

Furthermore, as shown in FIG. 3(b), after growing a nitride film 25 on the entire surface of the CVD oxide film 23 and intrinsic base region 24, impurities are diffused into the N-type epitaxial layer 20 from the P+ polysilicon 22 by heat treatment, thereby forming a P-type extrinsic base layer 26. Afterwards, using the P+ polysilicon 22 and CVD oxide film 23 as the mask, P-type impurity ions are implanted into the intrinsic base region 24, and a P-type intrinsic base layer 27 is formed.

Next, as shown in FIG. 3(c), the polysilicon grown on the entire surface of the nitride film 25 is anisotropically etched, and a polysilicon side wall 28 is formed. Using this polysilicon side wall 28 as the mask, the nitride film 25 other than the side wall of the P+ polysilicon base, electrode 22 and the peripheral part 29 of the intrinsic base region 24 is etched, and an emitter lead-out part hole 30 is self-aligned to the P+ polysilicon base electrode 22.

Finally, as shown in FIG. 3(d), the N+ polysilicon grown on the entire surface of the CVD oxide film 23 and intrinsic base region 24 is selectively etched by using the photoresist by photolithography as the mask, and an emitter electrode 31 is formed, and N-type impurities are diffused into the N-type epitaxial layer 20 from the N+ polysilicon emitter electrode 31 through the emitter lead-out part hole 30 by heat treatment, thereby forming an N-type emitter layer 32.

According to this manufacturing method of a semiconductor device, all of the extrinsic base region, emitter region, base electrode lead-out part and emitter electrode lead-out part can be formed by a self-aligned process, and the bipolar transistor may be reduced in dimensions and increased raised in speed.

In this prior art, using the P+ polysilicon base electrode 22 as the mask, P-type impurity ions are implanted into the intrinsic base region 24 to form the P-type intrinsic base layer 27. When forming the intrinsic base layer 27 by ion implantation, the junction depth of the intrinsic base layer 27 cannot be set less than 0.2 μm due to channeling at the time of ion implantation. If the intrinsic base layer 27 is deep, the transistor cut-off frequency becomes lowered, which is disadvantageous for raising the operating speed of the bipolar transistor. In the prior art, channeling is decreased by inclining the tilt angle by about 7 degrees to vertical to the semiconductor substrate at the time of ion implantation, but when the tilt angle is inclined, as shown in FIG. 3(b) the tilt pass is shaded by the P+ polysilicon base lead-out electrode 22, and the overlap quantity does not become uniform between the outer marginal part of the intrinsic base layer 27 and the inner marginal part of the extrinsic base layer 26 surrounding the intrinsic base layer 27. As a result, the leakage current between collector and emitter increases in the insufficient overlap portion, or the base resistance increases to induce a reduction of the high frequency characteristics.

Or, when the intrinsic base layer 27 is formed on the entire base region before the step of forming the polysilicon base lead-out electrode 22 and extrinsic base layer 26, the insufficient overlap of the extrinsic base layer 26 and intrinsic base layer 27 may be avoided. In this case, however, by the heat treatment in the step of forming the extrinsic base layer 26, the intrinsic base layer 27 becomes deeper, which also leads to a lowering of the high frequency characteristics.

SUMMARY OF THE INVENTION

It is hence a first object of the present invention to present a method of manufacturing a semiconductor device capable of preventing an increase of leakage current and a lowering of the high frequency characteristics by making the overlap amount between the outer marginal part of the intrinsic base layer and the inner marginal part of the extrinsic base layer surrounding the intrinsic base layer uniform.

It is a second object of the invention to present a method of manufacturing a semiconductor device capable of improving its high frequency characteristics by forming an extremely thin intrinsic base layer.

To achieve the above objects, the invention is intended to form an intrinsic base layer by doping impurities in the emitter electrode into the intrinsic base layer on the surface of the semiconductor substrate by heat treatment through the emitter lead-out part hole self-aligned to the base lead-out electrode. Thus, beneath the insulation film of the substrate surface between the base lead-out part hole and the emitter lead-out part hole, the outer marginal part of the intrinsic base layer and the inner marginal part of the extrinsic base layer overlap uniformly. Still more, the diffusion of impurities by heat treatment is very fast in the polysilicon emitter electrode as compared with that in the silicon substrate, so that an extremely shallow intrinsic base layer may be formed.

BRIEF DESCRIPTION OF THE DRAWINGS

FIGS. 2(a) to 2(e) are drawings comparing the characteristics of the present invention to that of the prior art.

DETAILED DESCRIPTION OF THE INVENTION

FIGS. 1(a) to 1(e) show an embodiment of the invention in the process sequential sectional views. An example of an NPN transistor is described below.

Figure 1:
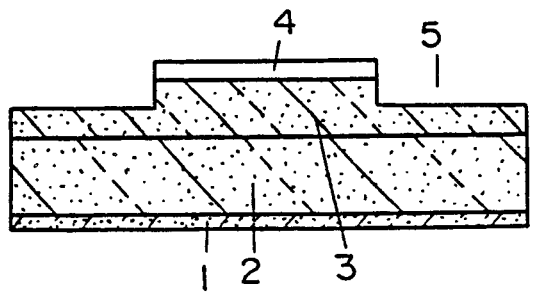
FIGS. 1(a) to 1(e) are manufacturing process sequential sectional structural drawings of a semiconductor device in accordance with one of the embodiments of the present invention.
Figure 1:
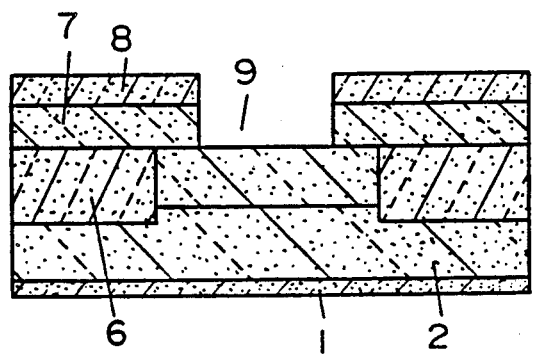
Figure 1:
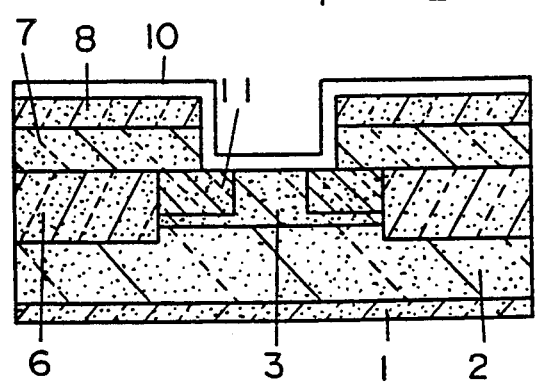
Figure 1:
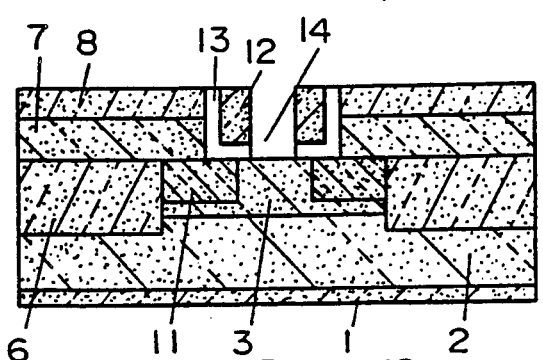
Figure 1:
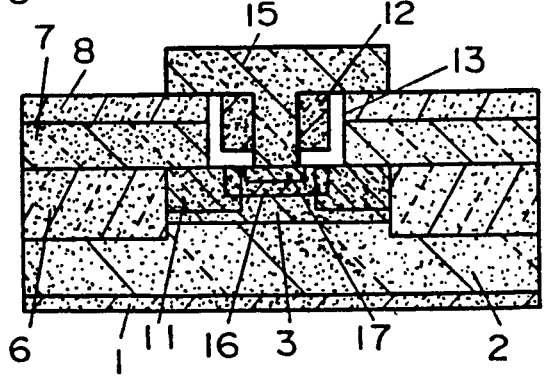
Figure 2A:
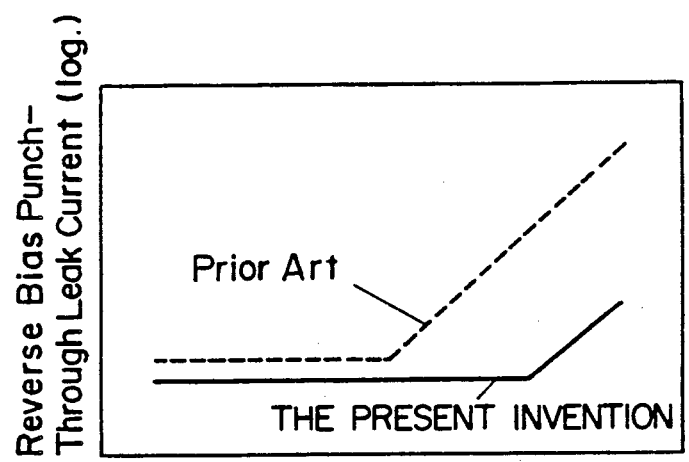
Figure 2B:
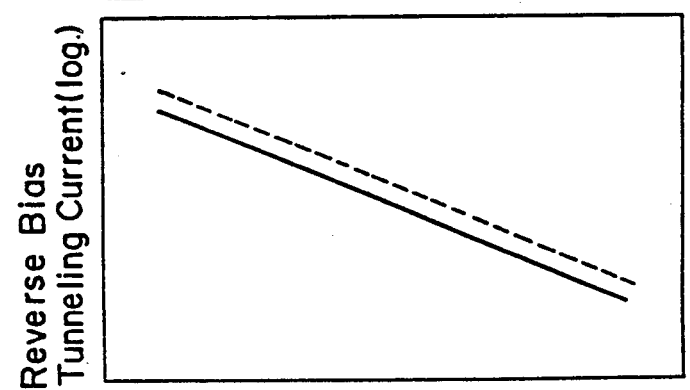
Figure 2C:
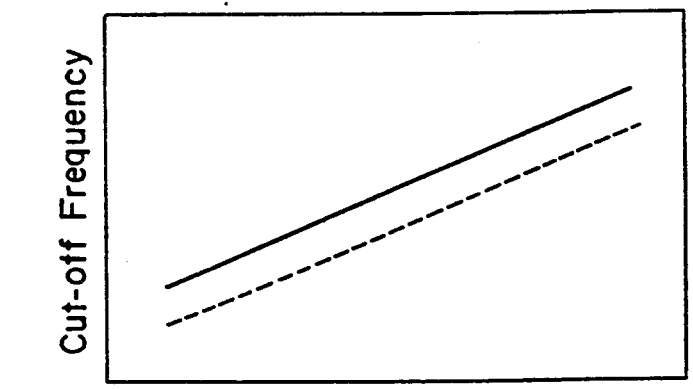
Figure 2D:
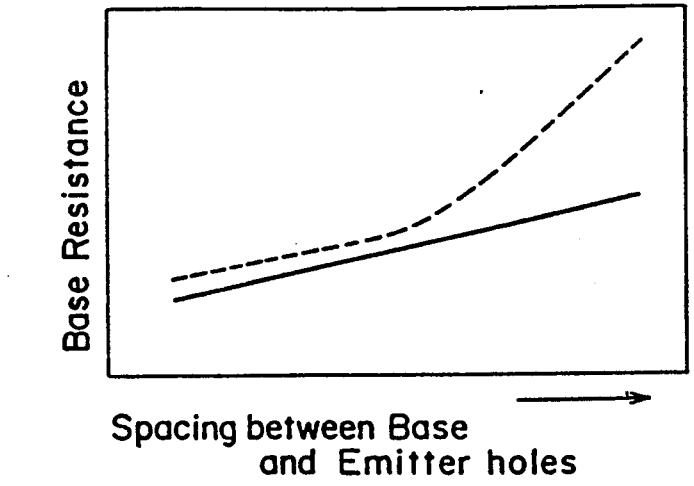
Figure 3A:
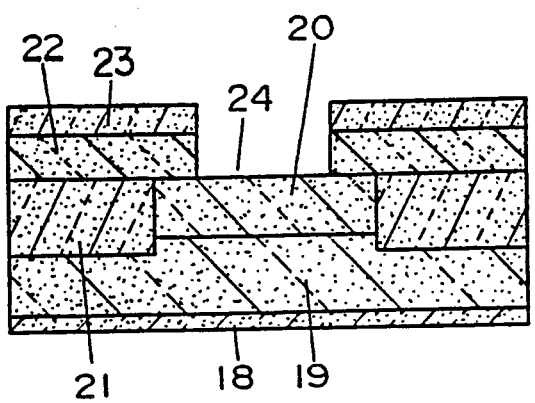
FIGS. 3(a) to 3(d) are manufacturing process sequential sectional drawings of a conventional semiconductor device.
Figure 3B:
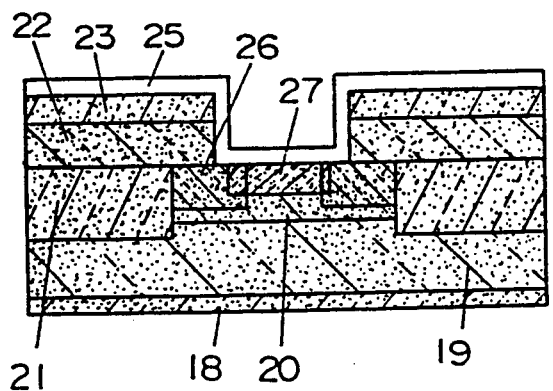
Figure 3C:
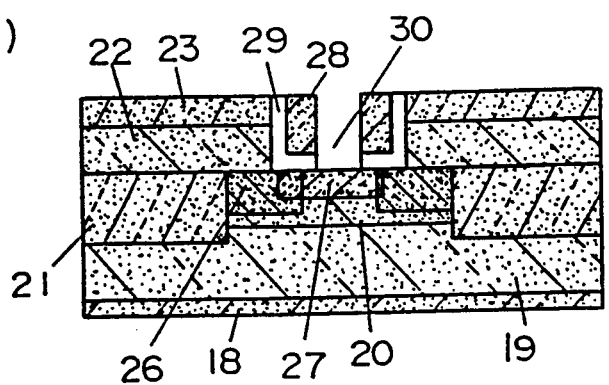
Figure 3D:
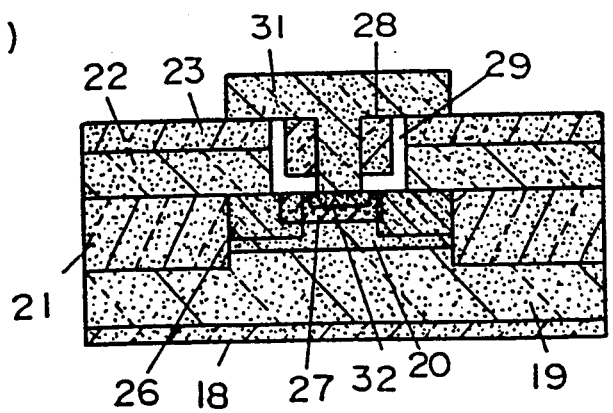

First, as shown in FIG. 1(a), a window is opened in a specified region of a photoresist by employing photolithography on the surface of a (111) P-type silicon substrate 1 with a boron concentration of about $1 \times 10^{14}$ to $2 \times 10^{15}$ cm$^{-3}$. Using this photoresist pattern as a mask, a dosage of 1 to $4 \times 10^{15}$ cm$^{-2}$ of antimony ions are implanted into the P-type silicon substrate 1 at an acceleration energy of 40 to 100 KeV. Afterwards, by performing heat treatment in an oxygen atmosphere for about 30 minutes at 1200° C., an N-type buried collector layer 2 with a junction depth of about 1 to 2 μm and a surface concentration of about 1 to $3 \times 10^{19}$ cm$^{-3}$ is formed. Heat treatment in an oxygen atmosphere, instead of nitrogen atmosphere, is intended to prevent nitriding of the surface of the silicon substrate 1, because nitriding causes crystal defects and induces deterioration of device characteristics. The substrate of (111) is used in this example, but the crystal direction of the substrate is not particularly limited. The oxide film on the surface of the P-type silicon substrate 1 formed at the time of heat treatment is removed by etching in a mixed solution of NH$_4$F and HF, and an epitaxial layer with an arsenic concentration of $5 \times 10^{15}$ to $3 \times 10^{16}$ cm$^{-3}$ is formed in a thickness of about 0.8 to 1.5 μm, and by using SiH$_2$Cl$_2$ and AsH gas, in the conditions of approximately 1000° to 1100° C., 10 to 100 Torr.

Using antimony which has a diffusion coefficient which is smaller than that of arsenic, by performing epitaxial growth by the CVD method at a relatively low temperature of about 1100° C. or less and a low pressure of about 100 Torr, the out-diffusion of the N-type buried collector layer 2 of high surface concentration of 1 to $3 \times 10^{19}$ cm$^{-3}$ into the epitaxial layer 3 can be controlled within the range of about 0.3 μm or less at the time of the expitaxial growth and of the subsequent heat treatment step. The thickness of the low impurity concentration portion of the epitaxial layer 3 may be a factor to determine the breakdown voltage of the device, and by controlling the out-diffusion, the thickness of the expitaxial layer 3 may be reduced while maintaining a sufficient thickness of the low impurity concentration portion of the epitaxial layer 3 necessary for guaranteeing the breakdown voltage of 7V or more between the collector and the emitter, and between the collector and the base. The film thickness of the epitaxial layer 3 is one of the factors to which determine the operating speed of the device, and by reducing the thickness of the epitaxial layer 3 to 1.5 μm or less, the collector transit time of the carrier in transistor operation can be shortened, so that a device capable of operating at a high speed may be realized. Furthermore, by reducing the thickness of the epitaxial layer 3 to 1.5 μm or less, the thickness of the LOCOS film for device isolation formed in a subsequent process may be also reduced, and the oxidation time for forming the LOCOS film may be shortened. Incidentally, when the silicon is oxidized, the volume expands, and undulations are formed on the silicon substrate surface when selectively oxidizing as in the case of formation of LOCOS film for device isolation, and therefore the step differences due to undulations of the LOCOS film may be decreased while reducing the thickness of the LOCOS film for device isolation.

If the antimony dosage is increased from the prescribed condition, the breakdown voltage of the device is lowered as mentioned above the to out-diffusion of the N-type buried collector layer 2 into the epitaxial layer 3 by heat treatment. On the contrary, when the antimony dosage is decreased from the specified amount, the sheet resistance of the N-type buried collector layer 2 increases and the collector resistance grows, thereby lowering the transistor characteristics. The impurity concentration of the epitaxial layer 3 is an important factor for determining the transistor breakdown voltage and the capacity due to the depletion layer width of collector-base junction. Meanwhile, the spreading of the effective base width due to excessive carriers in the base region when the transistor operates at high current density is called the Kirk effect, and the impurity concentration of the epitaxial layer 3 is one of the factors which determine this base spreading. The arsenic concentration of the epitaxial layer 3 is defined within $5 \times 10^{15}$ to $3 \times 10^{16}$ cm$^{-3}$ in order to maintain a sufficient transistor breakdown voltage, reduce the junction capacity between collector and base, and avoid the lowering of the high frequency characteristics due to the Kirk effect when the transistor operates at a high current density.

The advantages of using antimony as the impurity for forming the N-type buried collector layer 2 are mentioned herein, but it is not required to limit the method of the present invention to antimony, but by using arsenic, for example, it is possible to form a device possessing characteristics close to the case of using antimony. However, the optimum conditions are different in the impurity concentration of the N-type buried collector layer 2, impurity concentration of epitaxial layer 3, and film thickness. In this embodiment, assuming an integrated circuit, the N-type buried collector layer 2 is formed in the P-type silicon substrate 1 for device isolation, but where the device isolation is not necessary, such as the discrete semiconductor devices, without forming the buried collector layer 2, an epitaxial layer 3 may be directly formed on the N-type silicon substrate 1 with an impurity concentration of $3 \times 10^{17}$ to $3 \times 10^{19}$ cm$^{-3}$ approximately.

Succeedingly, by the low pressure CVD method using SiH$_2$Cl$_2$, NH$_3$, a silicon nitride film 4 having a thickness of 70 to 150 nm is grown on the entire surface of the epitaxial layer 3, and then the nitride film 3 in the device isolation region is removed by RF dry etching in a mixed gas of CF$_4$, CH$_3$Br, O$_2$, by using the photoresist pattern exposed and developed so as to open the device isolation region as the mask. Furthermore, the N-type epitaxial layer 3 is removed by a depth of about 0.4 to 0.8 μm by RF dry etching, using SF$_6$ gas, and a silicon groove 5 in a depth of about half of film thickness of the epitaxial layer 3 is formed, and the photoresist is removed by O$_2$ plasma etching.

Next, as shown in FIG. 1(b), using the nitride film 4 as the mask, a LOCOS film 6 for device isolation is formed in with a thickness of 1 to 1.8 μm as a first insulation film by selective oxidation by the high pressure pyro-oxidation method at 5 to 10 atmospheric pressures at 950° to 1050° C. To form the silicon groove 5 in a depth of about half of the thickness of the LOCOS film 6 for device isolation before forming the LOCOS film 6 is intended to reduce the film thickness of the LOCOS film 6 reaching the P-type silicon substrate 1 to about half that without the silicon groove 5, and to decrease the undulations formed on the surface due to formation of the LOCOS film 6 for by filling the silicon groove 5 with the LOCOS film which nearly coincides with the principal plane of the epitaxial layer due to expansion of the oxidized silicon. By employing, moreover, the high pressures pyro-oxidation method of 5 to 10 atmospheric pressures in this step, an oxidation rate equivalent to that at high temperature of about 1200° C. is realized, and at low temperature of 1050° C. or less and by shortening the oxidation time out-diffusion of the N-type buried collector layer 2 the epitaxial layer 3 due to heat treatment for oxidation may be decreased.

After etching and removing the nitride film 4 by using phosphoric acid solution, a polysilicon 7 to be used as a base lead-out electrode is formed in a thickness of about 300 to 500 nm by a low pressure CVD method in SiH$_4$ gas, and sequentially an oxide film 8 is grown on the entire surface of the polysilicon 7 in a thickness of about 150 to 300 nm by the low pressure CVD method by SiH$_2$Cl$_2$, N$_2$O. For the purpose of lowering the resistance of the polysilicon 7 as the base lead-out electrode, boron of a P-type impurity as first impurity is doped by ion implantation into the polysilicon 7 in the conditions of an implantation energy of 40 to 80 KeV and a dosage of $5 \times 10^{15}$ to $2 \times 10^{16}$ cm$^{-2}$. Then the oxide film 8 is removed by RF dry etching in a mixed gas of CHF$_3$, NH$_3$, and O$_2$. Consequently, in SF$_6$, C$_2$ClF$_5$ gas, the polysilicon 7 is removed by anisotropic dry etching. Removal of both oxide film 8 and polysilicon 7 is effected by using, as the mask, the photoresist pattern in a width of about 1.0 to 1.5 $\mu$m exposed and developed so as to open, excluding the base polysilicon electrode region, and an intrinsic base region 9 is exposed on the surface of the N-type epitaxial layer 3. Afterwards, the photoresist is removed by O$_2$ plasma ashing.

Herein the conditions are defined such as the film thickness of polysilicon 7 to be used as the base lead-out electrode in a range of 300 to 500 nm, the film thickness of oxide film 8 of about 150 to 300 nm and a boron ion implantation energy in of 40 to 80 KeV, which is intended to dope the boron sufficiently into the polysilicon 7 even in ion implantation across the oxide film 8, and to prevent the boron ions from reaching the intrinsic base region 9 on the surface of the N-type epitaxial layer 3, penetrating through the polysilicon 7. In other words, if the boron penetrates through the polysilicon 7 and reaches the intrinsic base region 9 on the surface of the epitaxial layer 3, the current gain of the transistor and operating frequency are lowered, and the device characteristics deteriorate. The reason why the oxide film 8 is not grown by the low pressure CVD method after ion implantation is to prevent the boron from entering the intrinsic base region 9 on the surface of the N-type epitaxial layer 3 due to solid state diffusion of boron impurities in the polysilicon 7 by heat treatment, usually at about 800° C., at the time of low pressure CVD growth. At a boron dosage of about $5 \times 10^{15}$ to $2 \times 10^{16}$ cm$^{-2}$, a polysilicon base lead-out electrode with sheet resistance of about 60 to 120 $\Omega$/square may be formed. If the dosage is larger than in this condition, the P-type extrinsic base layer 11 described below becomes deeper. Moreover, along with the increase of the base-collector junction capacity, the high frequency characteristics of the transistor deteriorate. Or if the dosage is smaller than in this condition, the base resistance increases, and the overlap between the P-type extrinsic base layer 11 and the intrinsic base layer 16 becomes insufficient, which may also lead to a lowering of characteristics.

In sequence, as shown in FIG. 1(c), by the low pressure CVD method with SiH$_2$Cl$_2$, NH$_3$, a nitride film 10 is grown on the entire surface of the oxide film 8, polysilicon 7 and epitaxial layer 3 with a thickness of 50 to 120 nm, and boron is diffused in the N-type epitaxial layer 3 from the P+ polysilicon 7 by heat treatment, thereby forming the P-type extrinsic base layer 11. At this time, when the heat treatment condition is specified as N$_2$ atmosphere, about 1000° C. and about 30 to 60 minutes, the extrinsic base layer 11 by boron is formed at a junction depth of about 0.25 to 0.35 $\mu$m and a surface concentration of about 1 to $3 \times 10^{20}$ cm$^{-3}$. Incidentally, the nitride film 10 becomes an electrical insulator between the base lead-out electrode 7 or extrinsic base layer 11 and the emitter electrode. Therefore, it is necessary to have a sufficient reliability as insulation film. Besides, if the nitride film 10 is too thick, the characteristic deterioration of the transistor due to stress of the nitride film 10 is predicted. Accordingly, a proper thickness of the nitride film 10 is about 50 to 120 nm.

Consequently, as shown in FIG. 1(d), the polysilicon grown on the entire surface of the nitride film 10 in a thickness of about 250 to 350 nm by the low pressure CVD method of SiH$_4$ is subjected to anisotropic etching in a mixed gas of SF$_6$ and CCl$_4$ which is a gas condition capable of etching at an extremely high degree of anisotropy, thereby forming a polysilicon sidewall 12. Using this polysilicon sidewall 12 as the mask, the nitride film 10 in areas other than the sidewall of the base lead-out electrode 7 and peripheral part 13 of the intrinsic base region 9 is subjected to RF etching in CF$_4$, CHBr$_3$, O$_2$ gas, so that the emitter lead-out part hole 14 is self-aligned so as to be of equal distance to the base lead-out electrode 7 at any position around the hole. Thus, a self-aligned forming of the base lead out electrode 7 and the emitter lead-out part hole 14 is intended to open a fine emitter lead-out part beyond the limit of the photolithographic technology, and to form extremely finely the extrinsic base layer 11 which is a parasitic region impeding the high speed operation of the device without having to consider the mask alignment margin photolithography or other conditions.

Finally, as shown in FIG. 1(e), the polysilicon grown in 200 to 300 nm by the low pressure CVD method of SiH$_4$ is subjected to RF etching with SF$_6$, C$_2$ClF$_5$ gas selectively, using as the mask the photoresist pattern exposed and developed so as to open other than the emitter polysilicon electrode region, and a polysilicon emitter electrode 15 is formed. In consequence, by O$_2$ plasma etching, the photoresist is removed. Then boron of P-type impurity as a second impurity is doped in the polysilicon emitter electrode 15 by ion implantation selectively, by using as the mask the photoresist pattern exposed and developed so as to open the emitter polysilicon electrode region, and after removing the photoresist by O$_2$ plasma etching, boron is diffused into the intrinsic base region 9 from the polysilicon emitter electrode 15 through the emitter lead-out part hole 14 by heat treatment in N$_2$ atmosphere, thereby forming a P-type intrinsic base layer 16. Furthermore, in the polysilicon emitter electrode 15, arsenic of N-type impurity as a third impurity is doped by ion implantation at 40 to 80 KeV, by about $5 \times 10^{15}$ to $2 \times 10^{16}$ cm$^{-2}$, selectively by using as the mask the photoresist pattern exposed and developed so as to open the emitter polysilicon electrode region, and after removing the photoresist by O$_2$ plasma etching, arsenic is diffused into an intrinsic base layer 16 from the polysilicon emitter electrode 15 through the emitter lead-out part opening 14 by heat treatment in N$_2$ atmosphere, thereby forming an N-type emitter layer 17.

In the process of forming the intrinsic base layer 16, when the boron ion implantation into the polysilicon of the emitter electrode 15, if the boron ions penetrate through the emitter electrode 15 to reach the epitaxial layer 3, the junction of the intrinsic base layer 16 becomes deep, and the base transit time of the transistor becomes long, which leads to a lowering of the high frequency characteristics of the transistor, and therefore the polysilicon film thickness and ion implantation conditions are determined so that the boron ions may not penetrate through the polysilicon of the emitter electrode 15. Therefore, if the polysilicon film thickness of the emitter electrode 15 is excessive, the emitter resistance increases and the high frequency characteristics of the transistor deteriorate, and hence the maximum thickness is around 300 nm, but when the polysilicon film thickness is 300 nm and the boron ion is implanted, the implantation energy should be 30 KeV or less. By the drive-in heat treatment of the intrinsic base layer 16 of the ion implantation dosage of about 2 to $4 \times 10^{14}$ cm$^{-2}$, 900° to 950° C., and about 30 to 60 minutes, the intrinsic base layer 16 of about 0.1 to 0.15 $\mu$m is formed at the a surface concentration of $5 \times 10^{18}$ to $2 \times 10^{19}$ cm$^{-2}$. The emitter layer 17 is formed as an extremely shallow layer at a depth of 0.05 $\mu$m or less, with a surface concentration of about $3 \times 10^{20}$ cm$^{-3}$, if the heat treatment is done for about 30 minutes at 900° C. The diffusion length in the lateral direction of each diffusion layer is about 80 to 85% of the depthwise direction, and at any position around the emitter lead-out part hole 14, a sufficient and uniform overlap of the extrinsic base layer 11 and intrinsic base layer 16 must be obtained under the nitride film 13 between the base lead-out part hole and emitter lead-out part hole 14, while the overlap between heavily doped diffused layers between the P-type extrinsic base layer 11 and N-type emitter layer 17 must be minimized and the problems of reliability due to tunneling currents and the like must be avoided, and hence for these purposes it is desired to set the following conditions. That is, the junction depth of the extrinsic base layer 11 is about 0.25 to 0.35 $\mu$m, and by forming a sidewall 12 by polisilicon of a thickness of 250 to 350 nm, the spacing between the emitter lead-out part hole 14 and the base lead-out part opening which consists of the inner marginal part of the LOCOS film 6 for device isolation and the nitride film 13 of the sidewall of the polysilicon base electrode 7 should be set to about 0.25 to 0.35 $\mu$m.

Thus, the boron of P-type impurity is doped by ion implantation into the polysilicon emitter electrode 15, the boron is introduced into the intrinsic base region 9 from the polysilicon emitter electrode 15 through the emitter lead-out part hole 14 by heat treatment, and the P-type intrinsic base layer 16 is formed, which is intended to form the intrinsic base layer 16 of about 0.10 to 0.15 $\mu$m in junction depth without having to restrict channeling by inclining the ion implantation angle by about 7 degrees as in the prior art since the diffusion of impurity is very fast in the polysilicon as compared with that in the silicon substrated, and to avoid crystal defects of the surface of the intrinsic base region 9 accompanying damage at the time of ion implantation. In particular, polysilicon is used in the base electrode because, in the self-aligned transistor, the damage on the surface of the intrinsic base region 9 when etching the polysilicon and exposing the intrinsic base region at the time of forming the base lead-out electrode 7 may induce defects to seriously influence the transistor characteristics at the time of ion implantation into the intrinsic base region 9 in a subsequent process. This problem, on the other hand, may be avoided by the method of forming the P-type intrinsic base layer 16 by introducing boron into the intrinsic base region 9 from the polysilicon emitter electrode 15 through the emitter lead-out part hole 14 by heat treatment.

Besides, the sidewall part is in double structure of polysilicon 12 and nitride film 13 as shown in the embodiment in FIGS. 1(a)-1(e), which is because the base-emitter junction around the emitter most seriously influencing in the bipolar transistor is covered by the nitride film 13 and its effect as the passivative film is expected, so that a reliable transistor may be formed. Besides, considering smaller stress of the polysilicon than of the nitride and the reduction of stress due to decrease of nitride film thickness, the lowering of the transistor characteristics due to stress may be prevented.

FIGS. 2(a)-2(d) are plottings of the characteristics such as reverse bias punch-through leak current (a) between collector and emitter of a transistor having the structure of the invention, reverse bias tunneling current (b) between the emitter and the base, cut-off frequency (c) and base resistance (d), with respect to the spacing between the base lead-out part hole and emitter lead-out part hole, shown in comparison with the conventional structure. When the spacing between the holes becomes short until the lateral diffusion part of the P-type extrinsic base layer 11 enters the N-type emitter layer 17, the tunneling current increases between the emitter and base, and the junction capacity between emitter and base increases and the base Gummel number in the emitter periphery increases, so that the cut-off frequency drops. On the contrary, when the hole interval is longer, the overlap between the P-type extrinsic base layer 11 and the intrinsic base layer 16 in the peripheral part of the emitter region is not sufficient, and the punch-through leakage between collector and emitter and the base resistance increase may occur.

In a transistor having the structure by self-aligned technology, it is important to optimize the emitter-base hole interval from the viewpoint of the trade-off as described above. As shown in FIGS. 2(a)-2(d) in the prior art, if the hole interval is wide, in particular, the problem of the uneven and insufficient overlap of the P-type extrinsic base layer 11 and intrinsic base layer 16 becomes more serious. Comparing the method of manufacturing semiconductor device of the present invention and with the prior art, this invention is advantageous when optimizing the emitter-base hole interval, and there is a high margin against unevenness in the process.

The example of an NPN transistor has been described so far, and the invention may be similarly applied to a PNP transistor as well.

As described herein, according to the method of manufacturing a semiconductor device of the present invention, the overlap between the extrinsic base and intrinsic base layer is sufficient, and a self-aligned bipolar transistor having an extremely shallow intrinsic base layer may be formed. Therefore, without having to increase the leak current between the collector and emitter or the base resistance, the cut-off frequency of transistor and high frequency characteristics of the integrated circuit may be greatly enhanced.

I claim:

1. A method of manufacturing a semiconductor device comprising the steps of:
   forming a buried collector layer on a semiconductor substrate;
   growing an epitaxial layer having a thickness of 1.5 μm or less on said buried collector layer;
   selectively forming a first insulation film in said epitaxial layer thereby defining a portion of said epitaxial layer surrounded by said first insulation film as an intrinsic base region;
   forming a first semiconductor film on said first insulation film and said intrinsic base region;
   removing a portion of said first semiconductor film so as to expose a surface of a center region of said intrinsic base region;
   forming a second insulation film at least on an exposed surface of said intrinsic base region and a sidewall of said first semiconductor film;
   forming an extrinsic base layer in a peripheral area of said intrinsic base region by diffusing a first impurity contained in said first semiconductor film into said peripheral area of said intrinsic base region through a gap between a sidewall of said first insulation film and the sidewall of said first semiconductor film;
   forming a second insulation film in a recess surrounded by said second insulation film;
   forming an emitter lead-out part hole by removing a center portion of said second semiconductor film and said second insulation film disposed on said intrinsic base region;
   forming a third semiconductor film in said emitter lead-out part hole;
   forming an intrinsic base layer in said intrinsic base region by diffusing a second impurity contained in said third semiconductor film thereby overlapping an outer marginal area of said intrinsic base layer and an inner marginal area of said extrinsic base layer, and
   forming an emitter layer in said intrinsic base layer by diffusing a third impurity contained in said third semiconductor film.

2. A method of manufacturing a semiconductor device comprising the steps of:
   forming a buried collector layer on a semiconductor substrate;
   growing an epitaxial layer with an arsenic concentration of $5 \times 10^{15}$ to $3 \times 10^{16}$ cm$^{-3}$ on said buried collector layer by a CVD method at a temperature of 1100° C. or less and a low pressure on the order of 100 Torr.;
   selectively forming a first insulation film in said epitaxial layer thereby defining a portion of said epitaxial layer surrounded by said first insulation film as an intrinsic base region;
   forming a first semiconductor film on said first insulation film and said intrinsic base region;
   removing a portion of said first semiconductor film so as to expose a surface of a center region of said intrinsic base region;
   forming a second insulation film at least on an exposed surface of said intrinsic base region and a sidewall of said first semiconductor film;
   forming an extrinsic base layer in a peripheral area of said intrinsic base region by diffusing a first impurity contained in said first semiconductor film into said peripheral area of said intrinsic base region through a gap between a sidewall of said first insulation film and the sidewall of said first semiconductor film;
   forming a second insulation film in a recess surrounded by said second insulation film;
   forming an emitter lead-out part hole by removing a center portion of said second semiconductor film and said second insulation film disposed on said intrinsic base region;
   forming a third semiconductor film in said emitter lead-out part hole;
   forming an intrinsic base layer in said intrinsic base region by diffusing a second impurity contained in said third semiconductor film thereby overlapping an outer marginal area of said intrinsic base layer and an inner marginal area of said extrinsic base layer, and
   forming an emitter layer in said intrinsic base layer by diffusing a third impurity contained in said third semiconductor film.

3. A method of manufacturing a semiconductor device comprising the steps of:
   forming a buried collector layer on a semiconductor substrate;
   growing an epitaxial layer with an arsenic concentration of $5 \times 10^{15}$ to $3 \times 10^{16}$ cm$^{-3}$ and a thickness of 1.5 μm or less on said buried collector layer by a CVD method at a temperature of 1100° C. or less and a low pressure on the order of 100 Torr.;
   selectively forming a first insulation film in said epitaxial layer thereby defining a portion of said epitaxial layer surrounded by said fist insulation film as an intrinsic base region;
   forming a first semiconductor film on said first insulation film and said intrinsic base region;
   removing a portion of said first semiconductor film so as to expose a surface of a center region of said intrinsic base region;
   forming a second insulation film at least on an exposed surface of said intrinsic base region and a sidewall of said first semiconductor film;
   forming an extrinsic base layer in a peripheral area of said intrinsic base region by diffusing a first impurity contained in said first semiconductor film into said peripheral area of said intrinsic base region through a gap between a sidewall of said first insulation film and the sidewall of said first semiconductor film;
   forming a second insulation film in a recess surrounded by said second insulation film;
   forming an emitter lead-out part hole by removing a center portion of said second semiconductor film and said second insulation film disposed on said intrinsic base region;
   forming a third semiconductor film in said emitter lead-out part hole;
   forming an intrinsic base layer in said intrinsic base region by diffusing a second impurity contained in said third semiconductor film thereby overlapping an outer marginal area of said intrinsic base layer and an inner marginal area of said extrinsic base layer, and
   forming an emitter layer in said intrinsic base layer by diffusing a third impurity contained in said third semiconductor film.

* * * * *